（12） United States Patent
Takahama et al.

(10) Patent No.: US 12,243,694 B2
(45) Date of Patent: Mar. 4, 2025

(54) ELEMENT MANUFACTURING METHOD

(71) Applicant: EneCoat Technologies Co., Ltd., Kyoto (JP)

(72) Inventors: Tsuyoshi Takahama, Kyoto (JP); Toshihiko Yabumoto, Kyoto (JP)

(73) Assignee: EneCoat Technologies Co., Ltd., Kyoto (JP)

( * ) Notice: Subject to any disclaimer, the term of this patent is extended or adjusted under 35 U.S.C. 154(b) by 527 days.

(21) Appl. No.: 17/252,714

(22) PCT Filed: Aug. 7, 2020

(86) PCT No.: PCT/JP2020/030490
§ 371 (c)(1),
(2) Date: Dec. 15, 2020

(87) PCT Pub. No.: WO2021/117291
PCT Pub. Date: Jun. 17, 2021

(65) Prior Publication Data
US 2021/0375556 A1      Dec. 2, 2021

(30) Foreign Application Priority Data

Dec. 12, 2019 (JP) .................................. 2019-224771

(51) Int. Cl.
*H01G 9/20* (2006.01)
*H01L 31/0465* (2014.01)
(Continued)

(52) U.S. Cl.
CPC ........... *H01G 9/20* (2013.01); *H01L 31/0465* (2014.12); *H10K 30/81* (2023.02); *H10K 39/12* (2023.02);
(Continued)

(58) Field of Classification Search
CPC ........ H01G 9/20; H10K 30/81; H10K 71/231; H10K 30/211; H10K 71/60; H10K 30/00;
(Continued)

(56) References Cited

U.S. PATENT DOCUMENTS

| 2005/0070107 | A1 | 3/2005 | Shinohara |
| 2007/0131271 | A1* | 6/2007 | Lim ................... H01L 31/1804 257/E27.125 |

(Continued)

FOREIGN PATENT DOCUMENTS

| CN | 1983568 A | 6/2007 |
| EP | 1798778 A2 | 6/2007 |

(Continued)

OTHER PUBLICATIONS

Zhen Li et al., "Scalable fabrication of perovskite solar cells," Nature Review (Materials), vol. 3, Article 18017, Mar. 27, 2018, Nature Portfolio (subsidiary of Springer Nature), UK, London.

(Continued)

*Primary Examiner* — Ermias T Woldegeorgis
(74) *Attorney, Agent, or Firm* — Liang Legal Group, PLLC (57) ABSTRACT

[Problem] To provide a method for manufacturing an element which does not lead to the occurrence of a short due to etching, and which suppresses the deterioration of a photoelectric conversion layer. [Solution] An element manufacturing method, wherein the method includes the following steps which are performed on an element material including an electrode formed on a substrate, the electrode having a first electrode and a second electrode which are separated from each other, and a photoelectric conversion layer formed in a region that includes the first electrode and the second electrode: a step in which a first back-side electrode and a second back-side electrode are formed at positions on (Continued)

the photoelectric conversion layer corresponding to a first electrode and a second electrode, wherein the first back-side electrode and the second back-side electrode are not connected; a step in which etching is performed using the first back-side electrode and the second back-side electrode as a mask; and a connection electrode formation step in which a connection electrode for connecting the first back-side electrode and the second back-side electrode is formed.

2 Claims, 5 Drawing Sheets

(51) Int. Cl.
*H10K 30/81* (2023.01)
*H10K 39/12* (2023.01)
*H10K 71/20* (2023.01)
*H10K 71/60* (2023.01)
*H10K 30/40* (2023.01)
*H10K 30/50* (2023.01)

(52) U.S. Cl.
CPC ........... *H10K 71/231* (2023.02); *H10K 71/60* (2023.02); *H10K 30/40* (2023.02); *H10K 30/50* (2023.02)

(58) Field of Classification Search
CPC ..... H10K 85/30; Y02P 70/50; H01L 31/0465; H01L 31/0463; Y02E 10/549
See application file for complete search history.

(56) References Cited

U.S. PATENT DOCUMENTS

| | | | |
|---|---|---|---|
| 2009/0206728 A1 | 8/2009 | Nozawa et al. | |
| 2011/0308588 A1* | 12/2011 | Nishi | H01L 31/03921 |
| | | | 257/E31.037 |
| 2016/0351841 A1* | 12/2016 | Suzuka | H10K 85/50 |
| 2019/0115487 A1* | 4/2019 | Huang | H01L 31/0504 |

FOREIGN PATENT DOCUMENTS

| | | | |
|---|---|---|---|
| JP | 2007-165903 A | 6/2007 | |
| JP | 2007-220360 A | 8/2007 | |
| JP | 2012-023357 A | 2/2012 | |
| JP | 2018-163938 A | 10/2018 | |
| TW | 1644448 B | 12/2018 | |

OTHER PUBLICATIONS

EPO, European Extended Search Report, Jan. 7, 2022.
CN IPO, first Office Action, Nov. 24, 2023.

* cited by examiner

ELEMENT MANUFACTURING METHOD

TECHNICAL FIELD

The present invention relates to a method for manufacturing an element such as a solar cell or an organic EL.

BACKGROUND ART

JP2018-163938A discloses a solar cell.

For example, in order to obtain a solar cell module with a high voltage, it is preferable to connect cells in series within the same substrate to create a solar cell module having an integrated structure.

Further, when separating a power generation layer in order to obtain a module having an integrated structure, it has been contemplated to perform etching using a mask so as to remove a portion of a perovskite layer and a hole transport layer. However, if such etching is performed, the portion that is masked is also removed, and this has caused a short (short circuit).

In particular, when separating the power generation layer by dry etching using plasma generated by a carbon tetrafluoride gas and an oxygen gas, there has been a problem in that sneaking under the mask occurred, which led to damage to the masked portion.

Moreover, when manufacturing a solar cell, deterioration of a photoelectric conversion layer has also been a problem.

PRIOR ART DOCUMENTS

Patent Documents

Patent Document 1: JP2018-163938A

SUMMARY OF INVENTION

Technical Problem

An object of an invention described in this specification is to provide a method for manufacturing an element which does not lead to the occurrence of a short due to etching. Another object of an invention described in this specification is to provide a method for manufacturing an element which suppresses the deterioration of a photoelectric conversion layer.

In addition to the above, a further object of an invention described in this specification is to provide a method for manufacturing a solar cell module having an integrated structure.

Solution to Problem

An invention described in this specification is based on the finding that an element can be manufactured without causing a short even if etching is performed by performing the etching on an element material having a power generation layer using a separated electrode (e.g., a back-side electrode) as a mask, and then forming a connection electrode.

An invention described in this specification relates to an element manufacturing method. In this element manufacturing method, an element is manufactured by preparing an element material, and then carrying out a process including a step for forming a back-side electrode, a step for etching, and a step for forming a connection electrode. Examples of the element include a solar cell and a solar cell module having an integrated structure.

The element material includes an electrode formed on a substrate, the electrode having a first electrode and a second electrode which are separated from each other, and a photoelectric conversion layer formed in a region that includes the first electrode and the second electrode.

The method includes:
a step in which a first back-side electrode and a second back-side electrode are formed at positions on a photoelectric conversion layer corresponding to a first electrode and a second electrode, wherein the first back-side electrode and the second back-side electrode are not connected;
a step in which etching is performed using the first back-side electrode and the second back-side electrode as a mask; and
a connection electrode formation step in which a connection electrode for connecting the first back-side electrode and the second electrode is formed.

In a preferred example of the method, the connection electrode formation step is a step in which the connection electrode is formed by screen printing. An example of the connection electrode formation step is a step in which the connection electrode is formed by screen printing. Normally, a back-side electrode must be formed by vapor deposition using a mask. However, by using screen printing, the electrode can be easily formed without damaging the layers.

In a preferred example of the method, the element material is manufactured by:
a step in which a first electron transport layer and a second electron transport layer are formed respectively on the first electrode and the second electrode;
a step in which a perovskite layer is formed on the first electron transport layer and the second electron transport layer; and
a step in which a hole transport layer is formed on the perovskite layer.

In a preferred example of the method, the element material is manufactured by:
a step in which a first hole transport layer and a second hole transport layer are formed respectively on the first electrode and the second electrode;
a step in which a perovskite layer is formed on the first hole transport layer and the second hole transport layer; and
a step in which an electron transport layer is formed on the perovskite layer.

Effects of Invention

An invention described in this specification provides a method for manufacturing an element which does not lead to the occurrence of a short due to etching. Further, an invention described in this specification provides a method for manufacturing an element which suppresses the deterioration of a photoelectric conversion layer.

In addition, an invention described in this specification provides a method for manufacturing a solar cell module having an integrated structure.

DESCRIPTION OF EMBODIMENTS

In the following, embodiments for carrying out the present invention shall be described using drawings. The present invention is not limited to the embodiments described below, and may be appropriately modified from the embodiments below within a scope that would be obvious to a person skilled in the art.

Examples of an element 1 include a solar cell and an organic EL element. Examples of the solar cell include a perovskite solar cell. A perovskite solar cell includes, for example, the following, in this order: an electrode; an electron transport layer; a perovskite layer (light absorbing layer); a hole transport layer; and a back-side electrode. The perovskite solar cell may be of an ordered type in which an n-type semiconductor layer is provided on the electrode, or may be of an inverse type in which a p-type semiconductor layer is provided on the electrode (in the inverse type, the following are formed, in this order: a substrate; an electrode; a hole transport layer; a perovskite layer; an electron transport layer; an electrode; and a connection electrode). In the following, the perovskite solar cell shall be explained using, as an example, a perovskite solar cell including the following, in this order: an electrode; an electron transport layer; a perovskite layer (light absorbing layer); a hole transport layer; and a back-side electrode.

Figure 1:
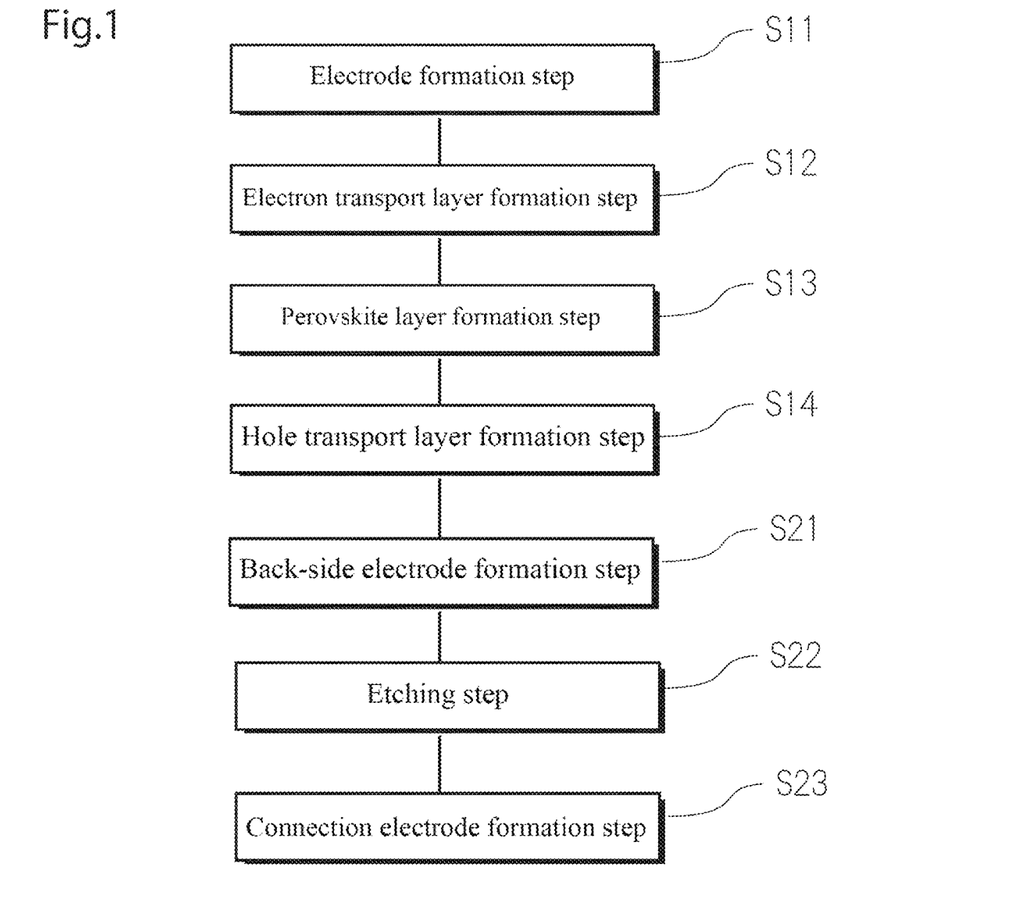
FIG. 1 is a flowchart illustrating an example of an element manufacturing method.

FIG. 1 is a flowchart illustrating an example of an element manufacturing method. As shown in FIG. 1, the element manufacturing method includes preparing an element material, and then a back-side electrode formation step (S21), an etching step (S22), and a connection electrode formation step (S23).

Examples of the element include a solar cell, a solar cell module having an integrated structure, and an organic EL element. These may appropriately include, in addition to the configurations explained below, publicly-known elements of a solar cell or an organic EL element.

Figure 2:
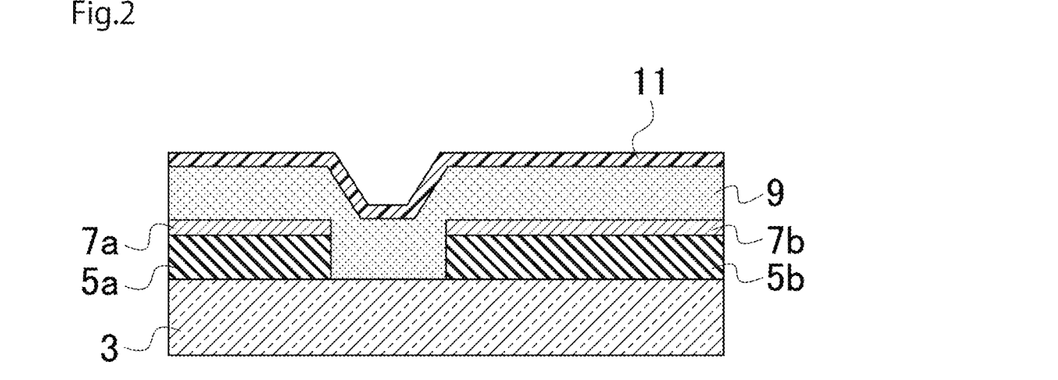
FIG. 2 is a schematic view illustrating an example of an element material.

FIG. 2 is a schematic view illustrating an example of the element material. As shown in FIG. 2, the element material includes: a substrate 3; an electrode 5 having a first electrode 5a and a second electrode 5b; a first electron transport layer 7a and a second electron transport layer 7b; a perovskite layer 9; and a hole transport layer 11. In this example, the first electron transport layer 7a, the second electron transport layer 7b, the perovskite layer 9, and the hole transport layer 11 function as a photoelectric conversion layer. The element material may include a photoelectric conversion layer having, in this order, a first hole transport layer, a second hole transport layer, a perovskite layer, and an electron transport layer.

Substrate 3

As the substrate 3, a publicly-known substrate for a perovskite solar cell or an organic EL element may be appropriately used. Examples of the substrate include a glass substrate, an insulator substrate, a semiconductor substrate, a metallic substrate, and an electrically-conductive substrate (including an electrically-conductive film). Further, a substrate in which at least one of a metallic film, a semiconductor film, an electrically-conductive film, and an insulating film is formed on part or all of the surface of the above substrates may also be suitably used.

Examples of a metal constituting the metallic film include one or two or more metals selected from gallium, iron, indium, aluminum, vanadium, titanium, chromium, rhodium, nickel, cobalt, zinc, magnesium, calcium, silicon, yttrium, strontium, and barium. Examples of a material constituting the semiconductor film include a single element such as silicon and germanium, compounds including an element from Groups 3 to 5 and Groups 13 to 15 of the periodic table, a metal oxide, a metal sulfide, a metal selenide, a metal nitride, and the like. Examples of a material constituting the electrically-conductive film include tin-doped indium oxide (ITO), fluorine-doped indium oxide (FTO), zinc oxide (ZnO), aluminum-doped zinc oxide (AZO), gallium-doped zinc oxide (GZO), tin oxide ($SnO_2$), indium oxide ($In_2O_3$), and tungsten oxide ($WO_3$). Examples of a material constituting the insulating film include aluminum oxide ($Al_2O_3$), titanium oxide ($TiO_2$), silicon oxide ($SiO_2$), silicon nitride ($Si_3N_4$), and silicon oxynitride ($Si_4O_5N_3$).

Examples of the shape of the substrate include plate-shaped such as a flat plate or a disc, fiber-shaped, rod-shaped, column-shaped, prism-shaped, cylinder-shaped, spiral-shaped, sphere-shaped, and ring-shaped, and the substrate may also have a porous structure. Among the above, a plate-shaped substrate is preferred. An example of the thickness of the substrate is preferably 0.1 μm to 100 mm, and more preferably 1 μm to 10 mm.

Electrode 5

The electrode is a support body for the electron transport layer, and is also a layer having a function to extract electrons from the perovskite layer (light absorbing layer). The electrode is formed on the substrate 3, and includes a first electrode 5a and a second electrode 5b which are separated from each other. Herein, "separated" means that the electrodes are not physically in contact, or that the first electrode 5a and the second electrode 5b are not short-circuited. The electrode is preferably a transparent electrode or a metallic electrode.

Examples of the transparent electrode include a tin-doped indium oxide (ITO) film, an impurity-doped indium oxide ($In_2O_3$) film, an impurity-doped zinc oxide (ZnO) film, a fluorine-doped tin dioxide (FTO) film, and a laminated film in which the above films are laminated. A metallic electrode indicates an electrode containing metal. Examples of the metallic electrode include gold, silver, and copper. The metallic electrode may include not only a metal, but also, on the surface of the metal, a tin-doped indium oxide (ITO) film, an impurity-doped indium oxide ($In_2O_3$) film, an impurity-doped zinc oxide (ZnO) film, a fluorine-doped tin dioxide (FTO) film, and a laminated film in which the above films are laminated. These films may also function as, for example, a diffusion prevention layer. The thickness of these electrodes is not particularly limited, and it is normally preferable to adjust the thickness so that the sheet resistance is 5 to 15Ω/□ (per unit area). The electrode may be obtained by a publicly-known film forming method according to the material to be formed.

Figure 3:
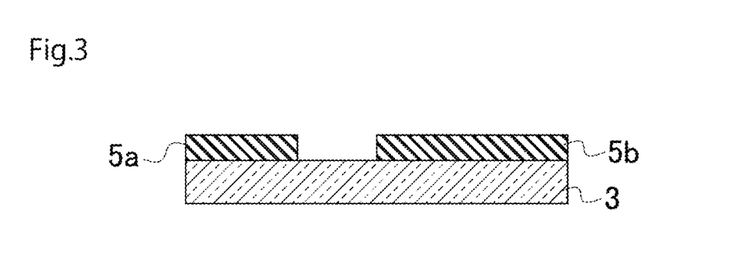
FIG. 3 is a schematic view illustrating an example of an electrode.

FIG. 3 is a schematic view illustrating an example of the electrode. As shown in FIG. 3, the electrode 5 includes the first electrode 5a and the second electrode 5b, and these electrodes are separated so that they do not connect. In the example of FIG. 3, two electrodes are depicted, but there may be 3 or more electrodes.

Electron Transport Layer 7

The element material includes an electron transport layer.

The electron transport layer 7 is formed to increase the active surface area of the perovskite layer (light absorbing layer) and improve the photoelectric conversion efficiency, as well as to facilitate electron collection. The electron transport layer may be a flat layer which uses an organic semiconductor material such as a fullerene derivative. The electron transport layer may also be a layer which includes a metal oxide such as titanium oxide ($TiO_2$) (including mesoporous $TiO_2$), tin oxide ($SnO_2$), and zinc oxide (ZnO). The thickness of the electron transport layer is not particularly limited, and in view of enabling better collection of electrons from the perovskite layer (light absorbing layer), the thickness is preferably about 10 to 300 nm, and more preferably about 10 to 250 nm.

The electron transport layer includes the first electron transport layer 7a and the second electron transport layer 7b which are formed respectively on the first electrode 5a and the second electrode 5b. Normally, the electron transport layer is patterned so as to have the same shape as the electrode present under the electron transport layer. The first electron transport layer 7a and the second electron transport layer 7b have, for example, the same shapes as those of the first electrode 5a and the second electrode 5b, respectively. Herein, the "same shape" does not mean identical in strict terms, and the shapes shall be deemed the "same" as long as they are designed to be approximately the same shape.

Perovskite Layer 9

The perovskite layer (light absorbing layer: photoactive layer) 9 of the perovskite solar cell is a layer that performs photoelectric conversion by absorbing light and causing excited electrons and holes to move. The perovskite layer (light absorbing layer) contains a perovskite material or a perovskite complex. The film thickness of the perovskite layer (light absorbing layer) is, for example, preferably 50 to 1000 nm, and more preferably 200 to 800 nm, in consideration of the balance between the light absorption efficiency and the electron and hole diffusion length, as well as the absorption efficiency of light reflected by the electrode. The film thickness of the perovskite layer (light absorbing layer) of the present invention may be measured by cross-sectional scanning electron microscopy (cross-sectional SEM).

Further, the flatness of the perovskite layer (light absorbing layer) of the present invention preferably exhibits a height difference of no more than 50 nm (−25 nm to +25 nm), and more preferably no more than 40 nm (−20 nm to +20 nm), in the range 500 nm×500 nm in the horizontal direction of the surface that was measured by the scanning electron microscope. This facilitates achieving a balance between the light absorption efficiency and the exciton diffusion length, and enables the absorption efficiency of light reflected by the electrode to be improved.

In the element material, the perovskite layer 9 is formed on the first electron transport layer 7a and the second electron transport layer 7b. In the example shown in FIG. 2, the perovskite layer is also formed in the portion (gap portion) on the substrate 3 where the first electrode 5a and the second electrode 5b are not present.

Hole Transport Layer 11

The hole transport layer 11 is a layer having a function of transporting a charge. The hole transport layer 11 is formed on the perovskite layer 9. For the hole transport layer, for example, a conductor, a semiconductor, an organic hole transport material, and the like can be used. These materials can function as a hole transport material that receives a hole from the perovskite layer (light absorbing layer) and transports the hole. The hole transport layer is formed on the perovskite layer (light absorbing layer). As the conductor and semiconductor, mention may be made of, for example, a compound semiconductor containing a monovalent copper such as CuI, $CuInSe_2$, and CuS, and compounds containing a metal other than copper such as GaP, NiO, CoO, FeO, $Bi_2O_3$, $MoO_2$, and $Cr_2O_3$. Among these, in view of more efficiently receiving only holes and achieving a higher hole mobility, a semiconductor containing a monovalent copper is preferable, and CuI is more preferable. As an organic hole transport material, mention may be made of, for example: polythiophene derivatives such as poly-3-hexylthiophene (P3HT) and polyethylene dioxythiophene (PEDOT); fluorene derivatives such as 2,2',7,7'-tetrakis-(N,N-di-p-methoxyphenylamine)-9,9'-spirobifluorene (Spiro-OMeTAD); carbazole derivatives such as polyvinylcarbazole; triphenylamine derivatives such as poly[bis(4-phenyl)(2,4,6-trimethylphenyl)amine] (PTAA); diphenylamine derivatives; polysilane derivatives; and polyaniline derivatives. Among these, in view of more efficiently receiving only holes and achieving a higher hole mobility, triphenylamine derivatives and fluorene derivatives, etc. are preferable, and PTAA, Spiro-OMeTAD, etc. are more preferable.

In the hole transport layer, for the purpose of further improving the hole transport characteristics, an oxidizing agent such as lithium bis (trifluoromethylsulfonyl) imide (LiTFSI), silver bis (trifluoromethylsulfonyl) imide, trifluoromethylsulfonyloxy silver, $NOSbF_6$, $SbCl_5$, $SbF_5$, and tris (2-(1H-pyrazol-1-yl)-4-tert-butylpyridine) cobalt (III) tri [bis(trifluoromethane)sulfonimide] can be incorporated. Further, in the hole transport layer, a basic compound such as t-butylpyridine (TBP), 2-picoline, and 2,6-lutidine can also be incorporated. The amount of the oxidizing agent and the basic compound to be incorporated can be set to an amount that is normally used in the prior art. In view of more efficiently receiving only holes and achieving a higher hole mobility, the film thickness of the hole transport layer is, for example, preferably 50 to 500 nm, and more preferably 100 to 300 nm.

As shown in FIG. 1, the element material may be manufactured by a method including the following: an electrode formation step (S11); an electron transport layer formation step (S12); a perovskite layer formation step (S13); and a hole transport layer formation step (S14). The element material may also be manufactured by a method including: a step for respectively forming a first hole transport layer and a second hole transport layer on a first electrode and a second electrode; a step for forming a perovskite layer on the first hole transport layer and the second hole transport layer; and a step for forming an electron transport layer on the perovskite layer.

Electrode Formation Step (S11)

In the electrode formation step (S11), an electrode is formed on a substrate. The electrode includes a first electrode and a second electrode which are separated from each other. Methods for forming the electrode on the substrate are publicly known. Examples of such publicly-known methods include performing etching with a resist pattern, and patterning using a laser.

Electron Transport Layer Formation Step (S12)

In the electron transport layer formation step, an electron transport layer (the first electron transport layer 7a and the second electron transport layer 7b) is formed on the electrode 3 (the first electrode 5a and the second electrode 5b). The electron transport layer can be obtained using a publicly-known film-forming method in accordance with the material to be formed. For example, the electron transport layer can be created by applying an aqueous dispersion of 3 to 15% by mass (in particular, 5 to 10% by mass) of tin oxide microparticles onto the electrode. A publicly-known or commercially-available tin oxide microparticle aqueous dispersion can be used. The application method is preferably spin coating. The application is performed at, for example, approximately 15 to 30° C. After the electrode and the electron transport layer have been formed on the substrate, etching with a resist pattern or patterning using a laser can be carried out.

Figure 4:
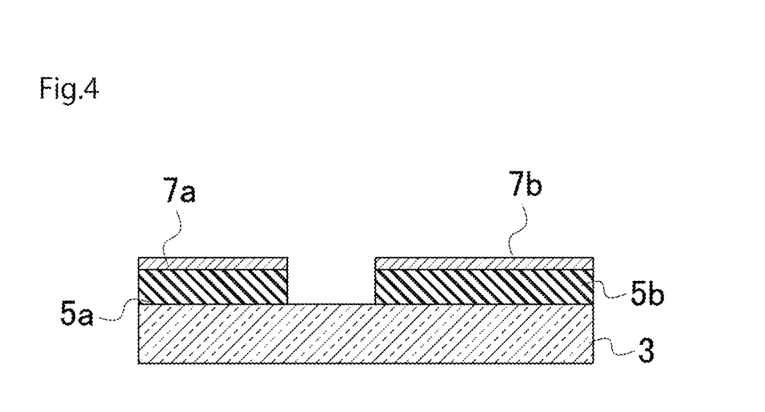
FIG. 4 is a schematic view illustrating the element material in the course of being manufactured at a stage after an electron transport layer formation step.

FIG. 4 is a schematic view illustrating the element material in the course of being manufactured at a stage after the electron transport layer formation step. As shown in FIG. 4, the electron transport layer (the first and second electron transport layers 7a, 7b) is formed on the electrode which is divided into multiple portions. In this example, the electrode is divided into two portions. However, the electrode may be divided into three or more portions.

Perovskite Layer Formation Step (S13)

In the perovskite layer formation step, the perovskite layer 9 is formed on the electron transport layer (the first electron transport layer 7a and the second electron transport layer 7b). The perovskite layer can be manufactured based on a publicly-known method.

An example of the perovskite layer formation step includes, in this order, a step for applying a solution containing a perovskite compound onto a substrate, a step for applying a poor solvent on the substrate, and a step for performing an annealing treatment on the substrate. In order to apply the solution containing a perovskite compound onto the substrate, spin coating, dip coating, screen printing, roll coating, die coating, transfer printing, spraying, or slit coating can be used. Among these, applying the solution onto the substrate by spin coating is preferable. Spin coating is a method in which a solution is dropped onto a substrate while rotating the substrate so as to coat the solution onto the substrate. Further, the substrate that has been loaded with the solution can be rotated so as to further coat the solution onto the substrate. The rotation speed may be set so that the maximum speed is 1000 to 10,000 rpm from 30 seconds to 5 minutes, wherein the time until the highest speed is reached from 2 to 15 seconds, and the time from the maximum speed until stopping is from 2 to 15 seconds.

Next, the step for applying a poor solvent on the substrate will be explained.

A poor solvent indicates a solvent which is capable of dissolving a solute, but in which the solubility of the solute is not high. As examples of such poor solvents, mention may be made of: substituted aliphatic hydrocarbons such as dichloromethane and chloroform; aromatic hydrocarbons such as toluene and benzene; substituted aromatic hydrocarbons such as chlorobenzene, ortho-dichlorobenzene, and nitrobenzene; acetic acid; ethers such as diethyl ether and tetrahydrofuran (THF); alcohols such as methanol, ethanol, isopropanol, butanol, and octanol; long-chain hydrocarbons (particularly C4-10 hydrocarbons) such as hexane; and acetonitrile. These poor solvents can be used alone, or two or more can be used in combination. Among the above, chlorobenzene or toluene is preferable.

Next, the step for performing an annealing treatment on the substrate will be explained. An annealing treatment indicates a step for heating, etc. the substrate. The annealing step is preferably performed quickly after dropping the poor solvent, or after the substrate has stopped upon completion of the spin coating. The step for performing an annealing treatment preferably includes a step for heating the substrate in a stepwise manner in a closed system which includes solvent vapor, as shown in the embodiments explained below. Further, in the closed system, vapor of a solvent included in the solution containing an Sn-based perovskite compound is preferably present, and within the closed system, the solvent preferably reaches the saturated vapor pressure or a partial pressure that is at least 90% of the saturated vapor pressure.

Hole Transport Layer Formation Step (S14)

In the hole transport layer formation step, the hole transport layer 11 is formed on the perovskite layer 9. As the method for forming the hole transport layer, a publicly-known method may be appropriately utilized. For example, the hole transport layer 11 is preferably formed by applying (spin coating, ink jetting, die coating, etc.) a solution containing an organic hole transport material onto the perovskite layer (light absorbing layer) in a dry atmosphere, and then heating at 30 to 150° C. (particularly 50 to 100° C.). An element material 21 is obtained once the hole transport layer is formed.

Figure 5:
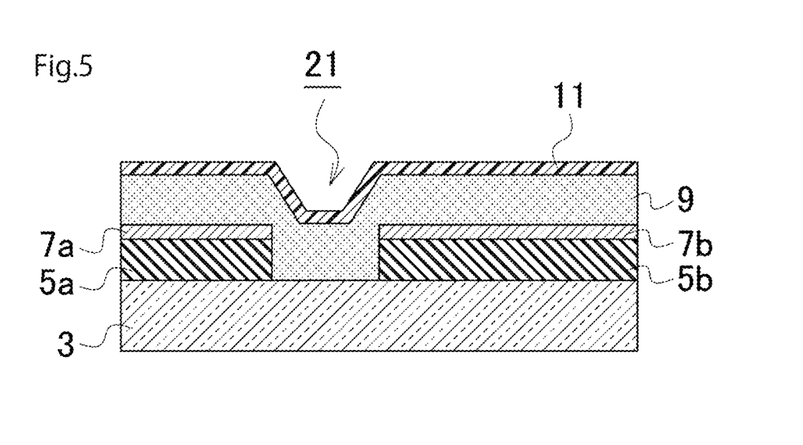
FIG. 5 is a schematic view illustrating the element material after a hole transport layer formation step.

FIG. 5 is a schematic view illustrating the element material after the hole transport layer formation step. As shown in FIG. 5, the hole transport layer 11 is formed so as to cover the entirety of the perovskite layer 9.

Back-Side Electrode Formation Step (S21)

In the back-side electrode formation step, a first back-side electrode 13a and a second back-side electrode 13b are formed on the hole transport layer 11 of the element material 21 at positions corresponding respectively to the first electrode 5a and the second electrode 5b.

The back-side electrodes 13a and 13b are electrodes which may also be referred to as metallic electrodes if they are metal. The back-side electrode is disposed opposing the electrode and is formed on the hole transport layer, and thereby charge exchange can be performed with the hole transport layer. As the back-side electrode, a publicly-known material used in the relevant industry can be used, and mention may be made of, for example, a metal such as platinum, titanium, stainless steel, aluminum, gold, silver, and nickel, or an alloy of such metals. Among these, the metallic electrode is preferably a material that can be formed by a method such as vapor deposition, since this allows the electrode to be formed in a dry atmosphere.

By appropriately combining publicly-known methods for the above-mentioned methods, a perovskite solar cell having a configuration other than the layer configuration described above can also be manufactured.

Figure 6:
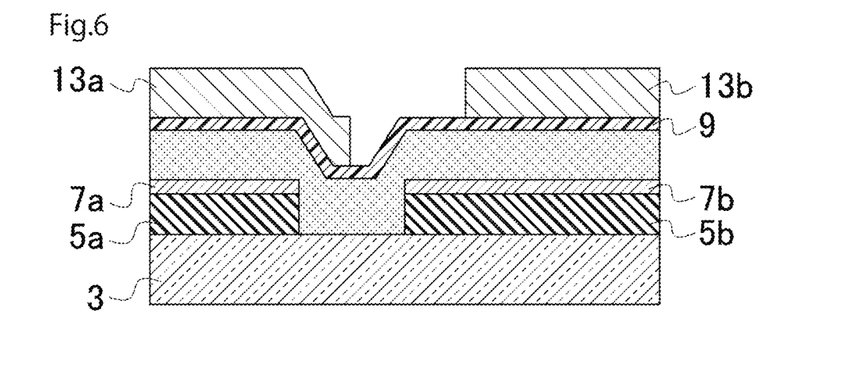
FIG. 6 is a schematic view illustrating an element in the course of being manufactured after a back-side electrode formation step.

FIG. 6 is a schematic view illustrating an element in the course of being manufactured after the back-side electrode formation step. As shown in FIG. 6, the back-side electrode does not have to have the same shape as the electrode and the electron transport layer. In the example of FIG. 6, the first and second back-side electrodes 13a and 13b are formed. A portion of the back-side electrode does not have to cover the electrode and the electron transport layer, thereby enabling a conductive connection to be achieved by a connection electrode. Further, a portion of the back-side electrode may be present in a portion in which the electrode and the electron transport layer are not provided. For example, the first back-side electrode 13a includes a main body portion, and a protruding portion that protrudes from the main body portion. The electrode and the electron transport layer are not provided to a portion below (in the substrate direction) the protruding portion. On the other hand, a protruding portion near the center of the first electrode 5a and the first electron transport layer 7a is not covered by the first back-side electrode 13a.

Etching Step (S22)

In the etching step, etching is performed using the first back-side electrode 13a and the second back-side electrode 13b as a mask. Etching steps are publicly known, and thus a publicly-known etching method can be appropriately implemented. An example of etching is dry etching.

Figure 7:
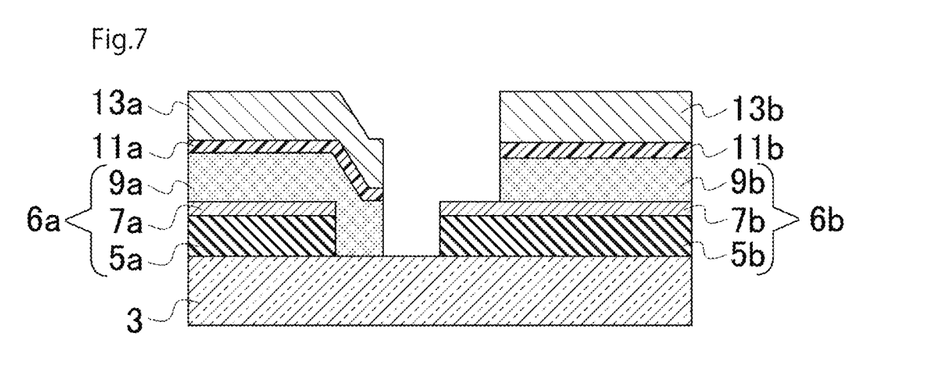
FIG. 7 is a schematic view illustrating the element in the course of being manufactured after an etching step.

FIG. 7 is a schematic view illustrating the element in the course of being manufactured after the etching step. As shown in FIG. 7, by performing the etching, the perovskite layer 9 and the hole transport layer 11 at the portion where the back-side electrode is not formed are removed. As a result, portions of the electron transport layers 7a and 7b and portions of the electrodes 5a and 5b are exposed at areas where the back-side electrode is not present. The photoelectric conversion layers on the first electrode 5a and the second electrode 5b may also be referred to as a first photoelectric conversion layer 6a and a second photoelectric conversion layer 6b. The first photoelectric conversion layer 6a includes the first electron transport layer 7a, a first perovskite layer 9a, and a first hole transport layer 11a, and the second photoelectric conversion layer 6b includes the second electron transport layer 7b, a second perovskite layer 9b, and a second hole transport layer 11b.

Connection Electrode Formation Step (S23)

In the connection electrode formation step, a connection electrode 15 for connecting the first back-side electrode 13a and the second back-side electrode 13b is formed. An example of the connection electrode formation step is a step for forming the connection electrode by screen printing. Normally, a back-side electrode must be formed by performing vapor deposition using a mask. However, by using screen printing, the electrode can be formed easily without damaging the layers.

Figure 8:
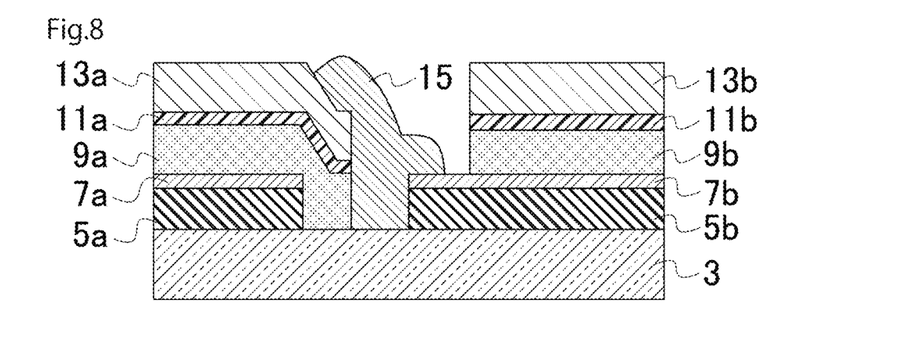
FIG. 8 is a schematic view illustrating the element in the course of being manufactured after a connection electrode formation step.

FIG. 8 is a schematic view illustrating the element in the course of being manufactured after the connection electrode formation step. In this example, for example, the first back-side electrode 13a and the second electrode 5b are connected by a first connection electrode 15a. A second connection electrode 15b is provided on the second back-side electrode 13b.

After the connection electrode formation step, for example, excess areas can be removed using a laser. Further, a sealing material layer (protective film) can be formed.

Sealing Material Layer

A sealing material layer 23 is provided to protect the photoelectric conversion portion. Examples of a material for constituting the sealing material layer include: thermoplastic resins such as ethylene-vinyl acetate copolymer (EVA), polyvinyl butyral (PVB), polyethylene terephthalate (PET), polyolefin (PO), and polyimide (PI); thermosetting resins such as epoxy, urethane, and polyimide; and an inorganic material such as glass. EVA, PO, and glass are preferable.

The thickness of the sealing material layer is, for example, preferably 0.1 to 10 mm, and the tensile elastic modulus of the sealing material layer is, for example, preferably 0.005 to 0.05 GPa. These parameters will be explained below.

The thickness of the sealing material layer is, for example, preferably 0.1 to 10 mm, and more preferably 0.2 to 1.0 mm. A sealing material layer with this degree of thickness can sufficiently seal and protect the photoelectric conversion portion.

The tensile elastic modulus of the sealing material layer is, for example, preferably 0.005 to 0.05 GPa, and more preferably 0.01 to 0.05 GPa. When the tensile elastic modulus of the sealing material layer is in such a range, stress caused by expansion/contraction of a surface protection substrate can be sufficiently relaxed.

Organic EL elements are publicly-known elements as disclosed in, for example, JP2017-123352A and JP2015-071619A, and methods for manufacturing these elements are also publicly known. An example of the organic EL element includes a substrate, a positive electrode, a negative electrode, and an organic layer disposed between the positive electrode and the negative electrode. The organic layer is constituted by laminating, in order from the positive electrode side, a hole injection layer, a hole transport layer, a light-emitting layer, an electron transport layer, and an electron injection layer.

Embodiments

In the following, examples of the invention disclosed in this specification shall be concretely explained using embodiments. The invention disclosed in this specification is not limited to the following embodiments, and publicly-known elements may be appropriately added thereto.

Figure 9:
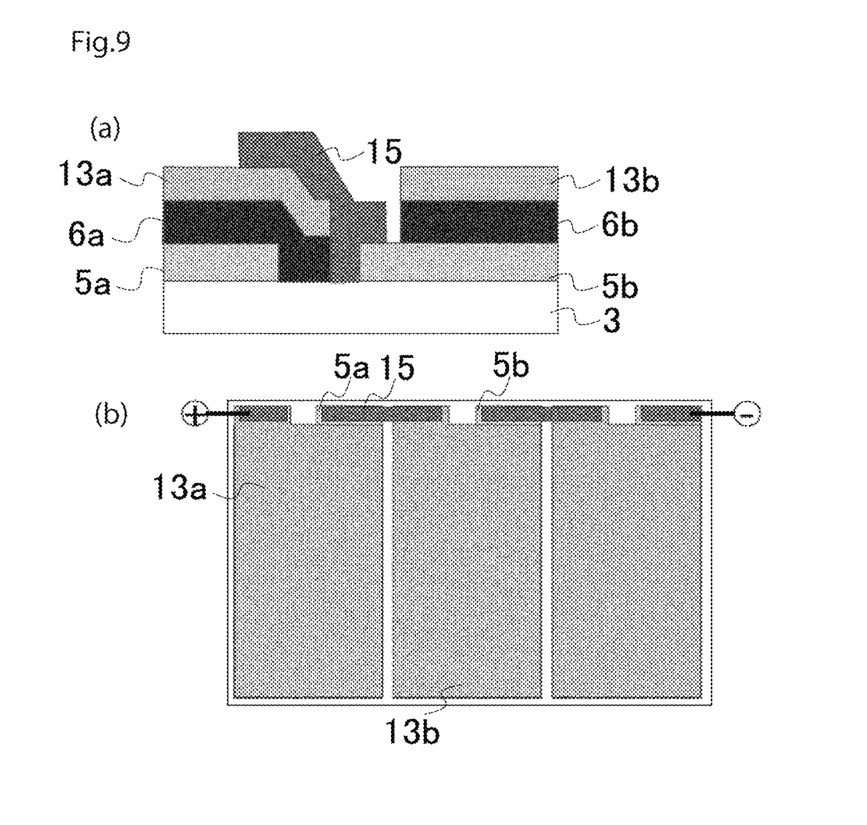
FIG. 9 is a schematic view for explaining a solar cell according to Embodiment 1.

FIG. 9 is a schematic view for explaining a solar cell according to Embodiment 1.

On a glass substrate 3, there is an ITO (indium tin oxide) of the electrode 5 that has been patterned into a prescribed shape in advance. Thereon, the electron transport layer 7, the perovskite layer 9, and the hole transport layer 11 are sequentially applied. The electron transport layer 7 can be formed by spin coating and then drying a colloidal $SnO_2$ aqueous solution. The perovskite layer 9 can be obtained with high quality by applying a prescribed material by spin coating and then further coating a poor solvent. The hole transport layer 11 can be obtained by spin coating and then drying a solution containing Spiro-MeOTAD.

The above layers are formed based on spin coating, and thus they are laminated over the entire surface of the substrate.

In the prior art, it was common to perform a process of patterning the layers that were laminated before the formation of the back-side electrode. However, this process is not performed in the present embodiment because high-precision patterning requires position accuracy of the layers including the subsequent back-side electrode, and this is not suitable for the present embodiment.

First, the back-side electrode 13 is formed. As a method for forming the back-side electrode, a metal mask is used to create a pattern in advance, and then the back-side electrode is formed with a sputtering device using a desired material as a target. The metal mask is formed so as to closely adhere to the laminated substrate 3. For the target material, molybdenum oxide ($MoO_3$), copper (Cu), and indium tin oxide (ITO) were used.

Next, dry etching using $CF_4$ and $O_2$ is performed to remove the laminated film in the region where the back-side electrode 13 is not present. At this time, the back-side electrode serves as a mask, and portions of the hole transport layer 11 and the perovskite layer 9 are removed. Thereby, the electrode 5 can be partially exposed at a portion where the back-side electrode 13 is not present. As the method for removing the laminated film, a pulse laser can be used.

Next, the connection electrode 15 is formed. The connection electrode 15 is formed by the same method as the back-side electrode, with a sputtering device using a metal mask. An electrically conductive paste can also be formed by screen printing. As a result, a solar cell module having an integrated structure can be obtained.

In the example of FIG. 9, photoelectric conversion layers (6a, 6b) including a photoactive layer are formed on three surface electrodes, and back-side electrodes are formed on the photoactive layers. The back-side electrodes are connected to each other in the upper region of FIG. 9, and the electrode on the left end is connected to a plus electrode and the electrode on the right end is connected to a minus electrode.

Figure 10:
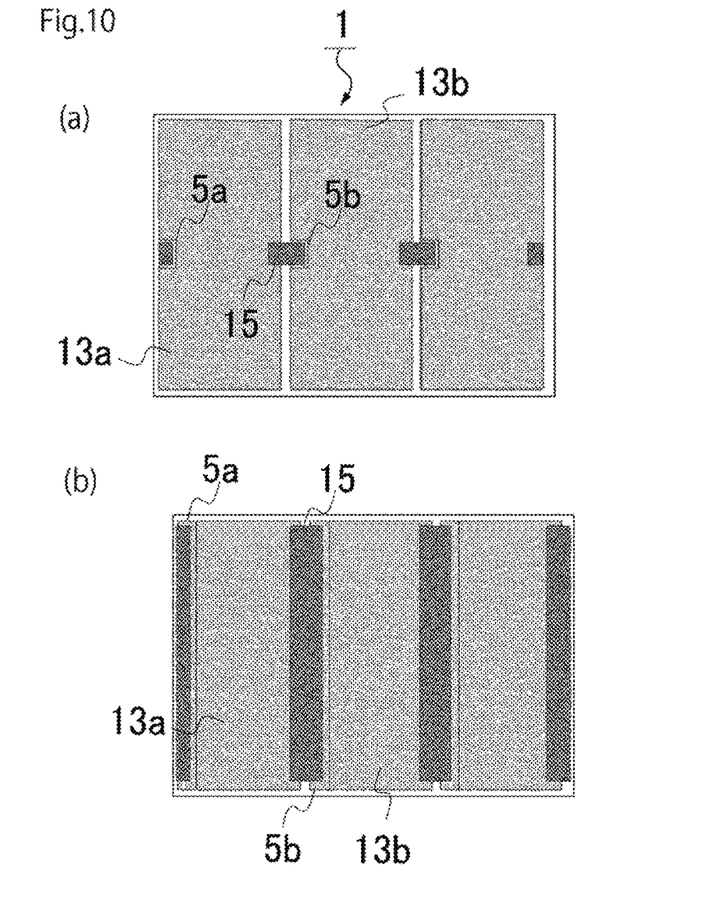
FIG. 10 is a schematic view for explaining solar cells according to Embodiments 2 and 3.

FIG. 10 is a schematic view for explaining solar cells according to Embodiments 2 and 3.

In Embodiment 2 shown in FIG. 10(*a*), connection regions of the back-side electrodes are provided in adjacent center regions of the surface electrodes and then connected to each other. In Embodiment 3 shown in FIG. 10(*b*), connection regions of the back-side electrodes are provided in adjacent regions of the surface electrodes and then connected to each other.

INDUSTRIAL APPLICABILITY

The present invention can be utilized in the technical field related to solar cells and organic EL elements.

REFERENCE SIGNS LIST

1: element
3: substrate
5: electrode
6a: first photoelectric conversion layer
6b: second photoelectric conversion layer
7a: first electron transport layer
7b: second electron transport layer
9: perovskite layer
11: hole transport layer
13a: first back-side electrode
13b: second back-side electrode
15: connection electrode
21: element material
23: sealing material layer

What is claimed is:

1. An element manufacturing method, wherein the method comprises the following steps which are performed on an element material including an electrode formed on a substrate, the electrode having a first electrode and a second electrode which are separated from each other, and a photoelectric conversion layer formed in a region that includes the first electrode and the second electrode:
    forming a first back-side electrode and a second back-side electrode on the photoelectric conversion layer at positions corresponding to the first electrode and the second electrode, wherein the first back-side electrode and the second back-side electrode are not connected;
    performing etching using the first back-side electrode and the second back-side electrode as a mask, wherein after etching, a first region on a surface of the substrate is covered by the first electrode, the photoelectric conversion layer, and the first back-side electrode, a second region on the surface of the substrate is exposed, and a third region on the surface of the substrate is covered by the second electrode, wherein a side face of the second electrode is exposed, wherein an upper surface of the second electrode is flat after performing etching; and
    forming a connection electrode to connect the first back-side electrode and the second electrode, wherein the connection electrode is attached to the second region of the surface of the substrate such that surfaces on the first back-side electrode and the second back-side electrode distal to the substrate are flat and not covered by the connection electrode;
wherein the element material is manufactured by:
    forming a first electron transport layer and a second electron transport layer respectively on the first electrode and the second electrode;
    forming a perovskite layer on the first electron transport layer and the second electron transport layer; and
    forming a hole transport layer on the perovskite layer;
wherein a part of the second electron transport layer is exposed after performing etching, wherein the exposed part of the second electron transport layer is over the upper surface of the second electrode and the surface; and
wherein one part of the connection electrode connects to the side face of the second electrode and another part of the connection electrode is on the exposed part of the second electron transport layer.

2. The element manufacturing method according to claim 1, wherein the forming the connection electrode is by screen printing.

\* \* \* \* \*